United States Patent [19]

King et al.

[11] 4,162,401

[45] Jul. 24, 1979

[54] HIGH-RESOLUTION, CRYOGENIC, SIDE-ENTRY TYPE SPECIMEN STAGE

[75] Inventors: Wayne E. King, Woodridge; Karl L. Merkle, Clarendon Hills, both of Ill.

[73] Assignee: The United States of America as represented by the United States Department of Energy, Washington, D.C.

[21] Appl. No.: 906,816

[22] Filed: May 17, 1978

[51] Int. Cl.² ............................................. G01N 23/00
[52] U.S. Cl. .................................. 250/311; 250/398; 250/526
[58] Field of Search ................ 250/396, 398, 311, 526

[56] References Cited

PUBLICATIONS

"Specimin Holder—Microscope" by J. W. Sprys, Rev. Sci. Inst., vol. 46, No. 6, Jun. 1975, pp. 773, 774.

Primary Examiner—Harold A. Dixon
Attorney, Agent, or Firm—Dean E. Carlson; Frank H. Jackson

[57] ABSTRACT

A high-resolution, cryogenic side-entry type specimen stage includes a copper block within which a specimen can be positioned in the electron beam of an electron microscope, one end of the copper block constituting a specimen heat exchanger, means for directing a flow of helium at cryogenic temperature into the heat exchanger, and electrical leads running from the specimen to the exterior of the microscope for four point D.C. electrical resistivity measurements.

9 Claims, 5 Drawing Figures

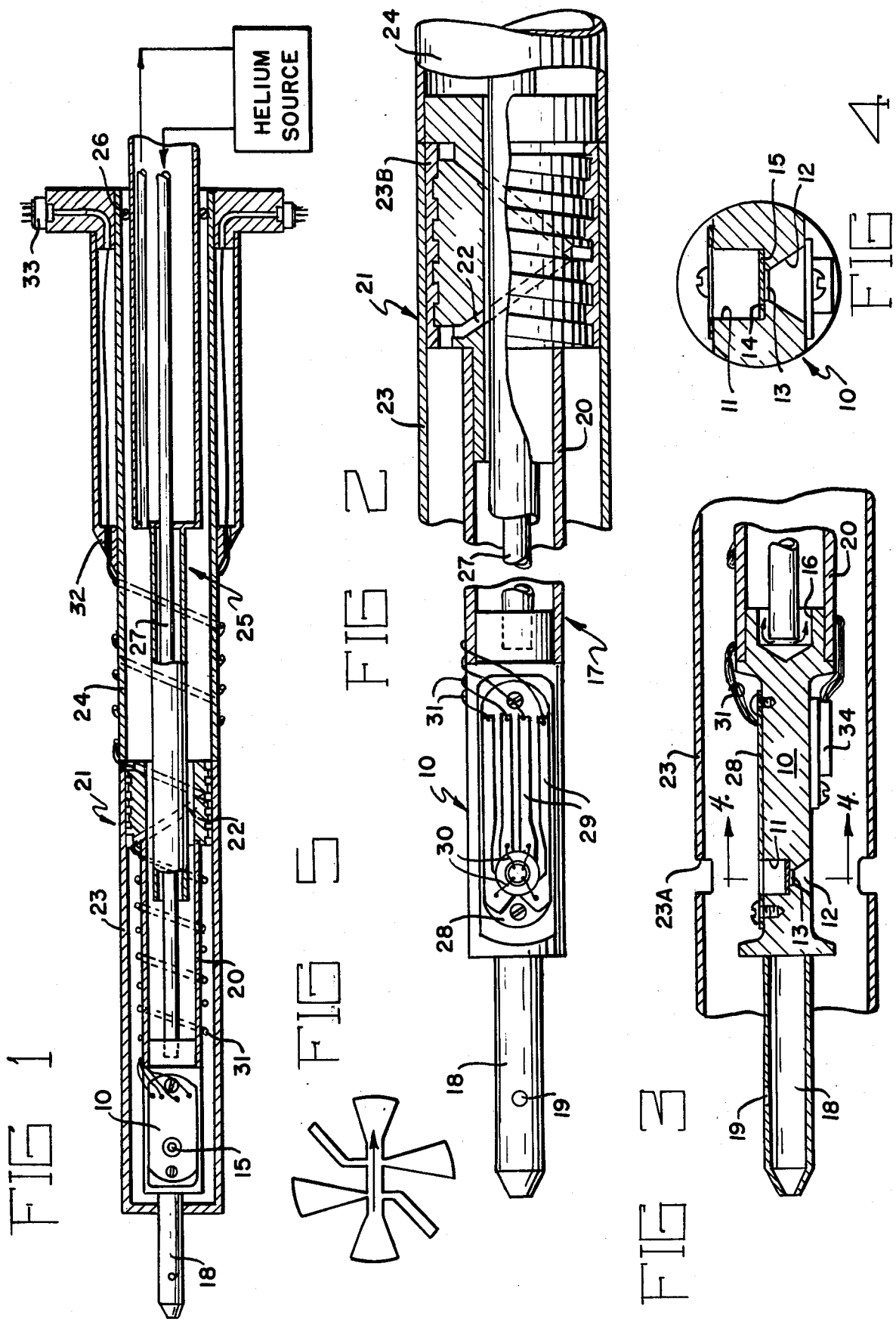

HIGH-RESOLUTION, CRYOGENIC, SIDE-ENTRY TYPE SPECIMEN STAGE

CONTRACTUAL ORIGIN OF THE INVENTION

The invention described herein was made in the course of, or under, a contract with the UNITED STATES DEPARTMENT OF ENERGY.

BACKGROUND OF THE INVENTION

This invention relates to a high-resolution, cryogenic, side-entry type specimen stage for a high-voltage electron microscope in which in-situ four point D.C. electrical resistivity measurements and electron optical observation can be made.

Studies of the effect of irradiation on metals are of great importance today. For example, extensive work is being done on electron damage studies of metals which might be useful in fusion reactors. For this purpose optical studies using electron microscopes are of importance. Likewise, resistivity studies are of great importance because defect damage increases the electrical resistivity which can be detected before the defects become pronounced enough to see visually. While both types of studies have been made in the past, no instruments are available within which electron optical studies and electrical resistivity measurements can be made simultaneously at cryogenic temperatures. The electrical resistivity measurements would complement the electron optical observation in the high-voltage electron microscope to yield a unique opportunity to investigate defect production in metals by electron irradiation over a wide range of defect concentration. The specimen stage described herein is designed to achieve the same electron optical resolution ($\sim 5$ Å) below $10°K$ as can be obtained at room temperature.

BRIEF DESCRIPTION OF THE FIGURES

FIG. 1 is a longitudinal section of a specimen stage for use in a high-voltage electron microscope constructed in accordance with the present invention, FIG. 2 is an enlarged section with parts broken away of the end of the stage which contains the specimen, FIG. 3 is a longitudinal section of a portion thereof taken at right angles to FIG. 2, FIG. 4 is a transverse cross section taken on the line 4—4 in FIG. 3, and FIG. 5 is a sketch showing the configuration of a specimen which can be used in the specimen stage.

DETAILED DESCRIPTION OF THE INVENTION

The specimen stage of the present invention includes a copper specimen block 10 which is cut away to form top and bottom flat faces and an aperture extending therethrough between faces. The aperture consists of an upper circular cylindrical portion 11, and a lower conical portion 12, there being a small hole 13 connecting the upper and lower portions. A ledge 14 on which rests a circular sapphire specimen holder 15 having a small hole in the center is thus formed at the bottom of the upper cylindrical portion.

One end of copper block 10 has a hollow 16 therein facing longitudinally of the block, this end of block 10 constituting a specimen heat exchanger 17. A thin-wall locating tip 18 having a hole 19 therein is attached to the other end of copper block 10. Locating tip 18 consists of a thin-wall tube to reduce heat exchange from the ambient temperature of the microscope locating socket to the cryogenic temperature of copper block 10. Hole 19 permits air to leak out of the top 18 when it is placed in a vacuum.

The return path of helium from the specimen block to a cold shield heat exchanger 21 is defined by a stainless steel downstream tube 20, into one end of which specimen heat exchanger 17 is socketed and into the other end of which a cold shield heat exchanger 21 is socketed. The cold shield heat exchanger 21 has a deep spiral groove 22 in the exterior surface thereof. A gold-plated copper cold shield 23 with a slot 23A therein for the electron beam encloses downstream tube 20 and copper block 10, contacts tip 18 and is threaded onto cold shield heat exchanger 21 employing a silver insert 23B for this purpose. Silver insert 23B is employed since copper would tend to seize and silver will provide better contact than copper since, when cooled, it will shrink down on the heat exchanger 21. Cold shield 23 serves to reduce radiation loss, to short circuit heat flow from tip 18 around copper specimen block 10 to cold shield heat exchanger 21 and to reduce contamination by condensing gases in a vacuum.

An upstream tube 24 of the same diameter as the cold shield 23 serves to further define the return flow path of the helium coolant. Heat exchanger 21 is socketed into upstream tube 24 and is soft soldered thereto. Downstream tube 20 and upstream tube 24 together with a helium transfer tube 25 disposed on the axis of the specimen stage define an annulus therebetween for a return flow of helium. The shield flow is used to reduce losses over the entire length of the transfer tube. An O-ring seal 26 closes this annulus. Transfer tube 25 includes an inlet coolant flow tube 27 whose tip is positioned without contact within the specimen heat exchanger 17. Helium transfer tube 25 will not be further described as this is a conventional, commercially available item except that it is capable of liquid/gas mixture or pure gas flow.

To accurately position the tip and to prevent the tip or any other part of the transfer tube from contacting the stage, an x,y,z positioning mechanism is attached to the upstream part of the transfer tube via a gimbel suspension such that the transfer tube can be tilted freely around a point concentric to O-ring seal 26. Contacting is monitored electrically. It is desirable to prevent contact between the transfer tip or other part of the transfer tube and the stage to prevent vibration of the transfer tube from causing the specimen stage to vibrate. Since these elements form no part of the present invention, they are not further described or shown in the drawing.

A sapphire junction block 28 having a hole therein coincident with cylindrical portion 11 of the aperture in copper block 10 is screwed to the top of copper block 10. Four gold pads 29 are silk-screened onto the sapphire junction block 28 extending from the hole therein to the opposite end thereof. Gold electrical wires 30 extend from the gold pads to a specimen attached to sapphire specimen holder 15. Four electrical leads 31—two current and two potential—extend from gold pads 29 to a point exterior of the microscope. Leads 31 are wrapped spirally around downstream tube 20, then spiral around cold shield heat exchanger 21 in groove 22 therein, then spiral around upstream tube 24, traverse feedthrough 32 and depart the specimen stage through external wire terminals 33. A platinum resistance thermometer 34 is fastened to the bottom of copper block 10 and electrical leads therefrom are conducted outside the specimen stage identically to the resistivity measurement leads, all leads being wrapped together around cold shield heat exchanger 21. Spare leads may be provided as desired. Leads 31 are fed through the vacuum using an epoxy which has a thermal expansion coefficient near that of stainless steel.

The flow cryostat uses helium gas as a coolant to attain and maintain any specified temperature between 10° and 300° K. Employing helium gas as coolant eliminates the vibrations that arise from boiling liquid helium and the temperature instabilities due to alternating heat-transfer mechanisms in the two-phase temperature regime (4.2°–15° K.). Provision can easily be made for use of a liquid-gas mixture for fast cool down.

Four-point D.C. electrical resistivity measurements can be made using a specimen configuration such as that shown in FIG. 5. Single crystal thin films, in the desired configuration and orientation, can be produced by vacuum evaporation. The photo-resist method can also be used to prepare specimens from rolled foils.

The specimen is attached to specimen holder 15 with the portion to be irradiated left free standing over hole 13. Every effort is made to obtain good thermal contact between the specimen holder 15 and the copper block 10. Gold contact pads (not shown) on the specimen holder 15 are used for electrical connections to the specimen. Gold wires 30 are welded to these contact pads on specimen holder 15 and to gold pads 29 on sapphire junction block 28. Current and potential leads 31 are soldered to pads 29. In this manner the junction block serves as a heat sink to the leads.

The specimen stage as thus described can be used to make electrical resistivity measurements and direct electron optical observation in a high-voltage electron microscope at cryogenic temperatures. The electrical resistivity measurements complement the electron optical observation in the high-voltage electron microscope to yield a unique opportunity to investigate defect production in metals by electron irradiation over a wide range of defect concentration.

The present stage may be installed in any microscope having side-entry capability in the same manner as a standard specimen stage. The side-entry format greatly simplifies the adaptation of the electrical resistivity measurements to the high-voltage electron microscope. At present, changes in the defect concentration of the order of 0.5 p.p.m. can be easily detected. In contrast to bath type cryostats, the operation of the flow cryostat is simple and economical.

The embodiments of the invention in which an exclusive property or privilege is claimed are defined as follows:

1. A side-entry type cryogenic specimen stage for a high-voltage electron microscope in which in-situ electrical resistivity measurements can be made comprising a copper block within which a specimen can be positioned in the electron beam of an electron microscope, one end of said copper block constituting a specimen heat exchanger, means for directing a flow of helium at cryogenic temperature thereinto, and at least four electrical leads running from the specimen to the exterior of the microscope for resistivity measurements.

2. Specimen stage according to claim 1 wherein the copper block has top and bottom flat faces and an aperture extending therethrough between faces, said aperture consisting of an upper circular cylindrical portion and a lower conical portion, there being a small hole connecting the upper and lower portions, a ledge being thus formed at the bottom of the circular cylindrical portion.

3. Specimen stage according to claim 2 wherein the copper block has a hollow therein at one end thereof facing longitudinally of the block, this end of the copper block constituting said specimen heat exchanger.

4. Specimen stage according to claim 2 and including a circular sapphire specimen holder having a small hole in the center attached to the ledge.

5. Specimen stage according to claim 4 and including a sapphire junction block fastened to the top of the copper block and having a hole therein aligned with the aperture in the copper block, four gold pads silk-screened onto the sapphire junction block extending from the hole therein to the end of the junction block, said electrical leads being electrically connected to said gold pads and electrical leads extending from the gold pads to a specimen attached to the sapphire specimen holder.

6. Specimen stage according to claim 1 and including a thin-wall locating tip having a hole therein attached to the other end of the copper block.

7. Specimen stage according to claim 1 wherein said means for directing a flow of helium at cryogenic temperature into said specimen heat exchanger comprises a stainless steel downstream tube having said specimen heat exchanger socketed in one end thereof and having a cold shield heat exchanger socketed in the other end thereof, and an upstream tube of the same diameter as the cold shield constituting an extension of the cold shield, a cold shield which contacts the locating tip and is threaded onto the cold shield heat exchanger, and a helium transfer tube disposed on the axis of the specimen stage, the cold tip thereof being located in the specimen heat exchanger.

8. Specimen stage according to claim 7 wherein said cold shield heat exchanger has a deep spiral groove in the exterior surface thereof, said electrical leads being wrapped tightly around the cold shield heat exchanger within the spiral groove therein.

9. A high-resolution, cryogenic, side-entry type specimen stage for a high-voltage electron microscope in which in-situ electrical resistivity measurements can be made comprising a copper specimen block having top and bottom flat faces and an aperture extending therethrough between faces, said aperture consisting of an upper circular cylindrical portion and a lower conical portion, there being a small hole connecting the upper and lower portions, a ledge being thus formed at the bottom of the circular cylindrical portion, a circular sapphire specimen holder having a small hole in the center attached to the ledge, one end of the copper block having a hollow therein facing longitudinally of the block, this end of the copper block constituting a specimen heat exchanger, a thin-wall locating tip having a hole therein attached to the other end of the copper block, a stainless steel downstream tube having said specimen heat exchanger socketed in one end thereof and having a cold shield heat exchanger socketed in the other end thereof, said cold shield heat exchanger including a deep spiral groove in the exterior surface thereof, a gold-plated copper cold shield which contacts the locating tip and is threaded onto the cold shield heat exchanger, an upstream tube of the same diameter as the cold shield constituting an extension of the cold shield, said cold shield heat exchanger being socketed into the upstream tube, a helium transfer tube disposed on the axis of the specimen stage, the cold tip thereof being located in the specimen heat exchanger whereby the copper block can be cooled to the desired temperature, a sapphire junction block fastened to the top of the copper block and having a hole therein aligned with the aperture in the copper block, four gold pads silk-screened onto the sapphire junction block extending from the hole therein to the opposite end thereof, electrical leads extending from the gold pads to a specimen attached to the sapphire specimen holder, and electrical leads extending from the exterior of the microscope to the gold pads, said leads being wrapped tightly around the cold shield heat exchanger within the spiral groove therein to cool the leads, preventing heat from reaching the specimen through the electrical leads.

* * * * *